US006691405B1

(12) United States Patent
Kagei

(10) Patent No.: US 6,691,405 B1
(45) Date of Patent: Feb. 17, 2004

(54) BOX ASSEMBLING APPARATUS AND METHOD FOR MOUNTING A PLURALITY OF DIFFERENT ELECTRIC/ELECTRONIC PARTS IN A BOX

(75) Inventor: Hiroshi Kagei, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 240 days.

(21) Appl. No.: 09/610,140

(22) Filed: Jul. 5, 2000

(30) Foreign Application Priority Data

Jun. 8, 1999 (JP) .......................................... 11-223677
Jul. 9, 1999 (JP) .......................................... 11-196464

(51) Int. Cl.[7] .................................................. H05K 3/30

(52) U.S. Cl. ............................ 29/832; 29/739; 29/740; 29/742; 29/771; 29/784; 29/783; 29/791; 29/799

(58) Field of Search .......................... 29/739, 740, 832, 29/742, 771, 784, 783, 791, 799; 294/87.1; 53/244, 238, 249, 250, 445, 471, 474, 155, 154, 138

(56) References Cited

U.S. PATENT DOCUMENTS 4,751,361 A * 6/1988 Inoue et al. ............. 219/69.12
4,759,124 A * 7/1988 Snyder et al. ................ 29/834
5,271,139 A * 12/1993 Sticht .......................... 29/430
5,636,425 A * 6/1997 Best ......................... 29/407.04
5,839,187 A * 11/1998 Sato et al. ..................... 29/743
5,894,657 A * 4/1999 Kanayama et al. ........... 29/740

FOREIGN PATENT DOCUMENTS

JP 10-040803 2/1998

* cited by examiner

*Primary Examiner*—A. Dexter Tugbang
*Assistant Examiner*—Tai Nguyen
(74) *Attorney, Agent, or Firm*—Gerald E. Hespos; Anthony J. Casella

(57) ABSTRACT

An apparatus is provided to simplify the construction of an assembling apparatus and shorten a tact time thereof for inserting a plurality of fuse into a box. In a fuse box assembling apparatus 1, fuses are fed one by one through outlets 2*a* of parts feeding units 2 provided for the respective kinds of fuses, and are inserted into a movable magazine 30. The movable magazine 30 is displaced to the respective outlets 2*a* by a displacing unit 5, thereby collecting necessary fuses in a specified order. The fuses are transferred from the movable magazine 30 to a fixed magazine 40 at once by a transferring mechanism 6 of the mounting unit 4, and are inserted one by one into a box by an inserting mechanism 7. Simultaneously with a fuse inserting operation, fuses to be inserted next are collected in the movable magazine 30.

7 Claims, 11 Drawing Sheets

BOX ASSEMBLING APPARATUS AND METHOD FOR MOUNTING A PLURALITY OF DIFFERENT ELECTRIC/ELECTRONIC PARTS IN A BOX

BACKGROUND OF THE INVENTION

1. Field of the Invention

The present invention relates to an assembling apparatus, such as a fuse box assembling apparatus, for mounting a plurality of electric and/or electronic parts, such as fuses, in a receiving member, such as box or a board, and particularly a fuse box of an automotive vehicle. Furthermore, the present invention relates to a box assembling method, such as a method for assembling parts in a fuse box.

2. Description of the Related Art

A prior art fuse box has a plurality of fuses of different sizes and shapes that are mounted in a box. A prior art fuse box assembling apparatus is provided with a plurality of parts-feeders for successively feeding the respective kinds of fuses. The assembling apparatus further includes an inserting unit for taking the fuses one by one from the feeders and inserting them into a box. The inserting unit includes a clamping device for clamping each fuse and an arm mechanism for moving the clamping device between the respective parts feeders and the box. The respective parts feeders are arrayed side by side at one end of the assembly apparatus and the box is provided at the other end thereof. One fuse is selected from each parts feeder, taken out by the inserting unit, conveyed from the one end of the assembling apparatus to the other end, and inserted into the box. Assembly of the fuse box is completed after a series of these operations are repeated for all fuses.

The above described fuse box assembling apparatus requires a fuse to be taken from the respective parts feeder every time a fuse is to be inserted. This prior art process takes time and the fuse inserting operation cannot be performed while the clamping device moves between the parts feeders and the box. As a result, a tact time for assembling one fuse box, which is the time for completing a step or cycle in a process, tends to be longer.

To realize a shorter time, a fuse box assembling apparatus may be considered with a combination of the parts feeder and an inserting unit for each kind of fuse, and with a plurality of these combinations arrayed in a line according to the fuses to be mounted. However, such an assembling apparatus is large and complicated. Further, since there are many products in process, it is difficult to switch quickly between the kinds of fuse boxes when many kinds of fuse boxes are manufactured.

Prior art fuses come in different sizes and shapes, all of which must be accommodated by the prior art fuse box assembly apparatus. More particularly, the parts-feeders of the prior art fuse box assembling apparatus must successively feed the different types of fuses along transport rails. The prior art inserting units then receive the fuses one by one from the parts-feeders and insert the received fuses into a box. Each inserting unit includes clamping hands for clamping the fuse, and an arm mechanism for moving the clamping hands between the corresponding parts feeder and the box. However, the configurations of the transport rails of the parts feeder and the configurations and opening amount of the clamping hands may need to differ in view of the different sizes and shapes of the fuses. As a result, a special insertion station is provided for each type of fuse, and each insertion station includes a parts feeder and an inserting unit.

The requirement for a special inserting station for each type of fuse results in a very large assembling apparatus.

The present invention was developed to solve the above technical problem, and an object of invention is to provide a box assembling apparatus and a box assembling method which allow easy mounting of a plurality of electric and/or electronic parts, and which can quickly mount a plurality of different kinds of fuses despite its simple construction.

SUMMARY OF THE INVENTION

The subject invention is directed to an assembling apparatus for mounting a plurality of electric/electronic parts, preferably fuses, in or on a receiving member, such as in a box or on a board. The board could be, for example, an electric or electronic board. The assembling apparatus comprises a fixed mounting unit with a first parts-holding member for holding a plurality of parts that are necessary to assemble a receiving member. The parts are held in the order in which they are to be mounted in the receiving member. The fixed mounting unit is adapted to successively mount in the receiving member the plurality of parts held by the first parts-holding member. The assembling apparatus also comprises a second parts-holding member, which holds a plurality of parts in the order that they are to be mounted. The second parts-holding member is movable between one or more feed positions, where the parts are fed automatically or semi-automatically to the second parts-holding member, and a position corresponding to the mounting unit. The assembly apparatus further comprises a transferring mechanism for transferring the plurality of parts held by the second parts-holding member at once to the first parts-holding member of the mounting unit when the second parts-holding member comes to the position corresponding to the mounting unit.

According to a preferred embodiment of the invention, the apparatus further comprises a plurality of fixed parts-feeding units. Each fixed parts-feeding unit includes a parts chamber for at least partly accommodating a specified kind of parts, such as fuses. Each fixed parts feeding unit further includes a feeding mechanism for successively feeding the accommodated parts.

The second parts-holding member preferably is movable between positions substantially facing the respective parts-feeding units and a position substantially facing the mounting unit. The second parts-holding member holds a plurality of parts in the order that they are mounted by being moved successively to the positions substantially facing the parts-feeding units that accommodate the parts necessary to assemble the box or other such receiving member. The second parts-holding member receives and holds the parts fed from the parts-feeding units, and then is moved to the position substantially facing the mounting unit.

According to a further preferred embodiment of the invention, there is provided a fuse box or board assembling apparatus for mounting a plurality of fuses in a box or on a board. For simplicity, the apparatus will be described only with respect to a fuse box. The apparatus comprises a plurality of fixed parts-feeding units. Each fixed parts-feeding unit includes a fuse chamber for accommodating a specified kind of fuses and a feeding mechanism for successively feeding the accommodated fuses. The apparatus also has a fixed mounting unit with a holding means for holding a plurality of fuses necessary to assemble a fuse box in an order that they are to be mounted in the box. The holding means is adapted to successively mount in the box the plurality of fuses held by the holding means. The apparatus further has a parts-holding member, which is movable between positions facing the respective parts-feeding units and a position facing the mounting unit. The parts-holding member holds a plurality of fuses in the order that they are to be mounted by being moved successively to the positions facing the parts-feeding units that accommodate the fuses necessary to assemble the fuse box. More particularly, the parts-holding member receives and holds the fuses fed from the parts-feeding units, and then moves to the position facing the mounting unit. The apparatus also includes a transferring mechanism for transferring the plurality of fuses held by the parts-holding member at once to the holding means of the mounting unit when the parts-holding member comes to the position facing the mounting unit.

With the above construction, a specified number of fuses are collected in the parts-holding member from the respective parts-feeding units for one fuse box, and are transferred at once to the mounting unit to be mounted.

Further, if a plurality of fuse boxes is to be assembled, a fuse collecting operation for a fuse box to be assembled next is performed simultaneously with a fuse mounting operation for the previous fuse box being assembled. In addition, the collected fuses can be transferred at once to the mounting unit by the transferring mechanism. As a result, the pause of the mounting unit for the preparation of parts can be suppressed, thereby shortening the process time or tact time.

Furthermore, the construction of the fuse box assembling apparatus can be simplified since it is not necessary to provide many mounting units, transferring mechanisms and parts holding members.

Preferably, the parts-holding member is moved to the positions corresponding to or substantially facing the plurality of parts-feeding units in a specified sequence to receive and hold a plurality of parts or fuses in the order that they are to be mounted while the mounting unit is at least partly mounting the parts or fuses in the box. With this construction, a plurality of fuses to be mounted next can be securely collected in the parts-holding member, and the process time or tact time can be shortened even more.

According to the invention, there is further provided an assembling method for mounting a plurality of electric/electronic parts, preferably fuses, in or on a box or in or on an electric or electronic board. The method comprises holding a plurality of parts necessary to assemble a receiving member in an order that they are to be mounted in or on the receiving member. The parts are held with a first parts-holding member of a fixed mounting unit that is adapted to successively mount the plurality of parts held by the first parts-holding member in the receiving member. The method then comprises automatically or semiautomatically feeding the parts to a second parts-holding member that holds the plurality of parts in the order that they are to be mounted. The method proceeds with moving the second parts-holding member to a position corresponding to a mounting unit. The method then further comprises transferring the plurality of parts held by the second parts-holding member at once to the first parts-holding member of the mounting unit when the second parts-holding member comes to the position corresponding to the mounting unit. The transferring step is carried with a transferring mechanism.

According to a preferred embodiment of the invention, the step of moving the second parts-holding member to the position(s) where the plurality of parts-feeding units are disposed is performed at least partially at the same time with the step of at least partly mounting the parts in the receiving member by means of the mounting unit.

According to the invention, there is further provided an assembling apparatus, for mounting a plurality of kinds of electric/electronic parts, preferably of fuses, having different configurations in or on or at a receiving member, such as a box or an electric or electronic board. The apparatus comprises a parts-holding member for holding a plurality of parts necessary to assemble a receiving member while substantially aligning or arranging the parts in an order that they are to be mounted. The apparatus also comprises a transferring mechanism for successively feeding the plurality of parts held by the parts-holding member through an outlet of the parts-holding member. A pair of holding members is provided, such the holding members are at substantially opposite sides of the part at the outlet, and such that the holding members can be opened and closed with respect to each other for receiving the parts fed by the transferring mechanism to mount them in the receiving member. At least one pair of locking portions are provided on the pair of holding members, and substantially are opposed to each other. The apparatus further comprises a vertically displacing mechanism for vertically displacing the pair of holding members between an upper position where the holding members substantially face the outlet of the parts-holding member and a lower position corresponding to a state where the part is at least partly mounted in the box.

According to a preferred embodiment, the locking portions have a step like shape comprised of a recessed upper portion and a projecting lower portion in such a manner as to correspond to the plurality of parts. Thus projections at upper side surfaces of the parts can be placed on the projecting lower portions of the locking portions when the holding members are closed with respect to each other.

According to a further preferred embodiment of the invention, a fuse box assembling apparatus is provided for mounting in a box a plurality of kinds of fuses that have different configurations. The apparatus comprises a parts-holding member for holding a plurality of fuses necessary to assemble a fuse box while aligning them in an order in which they are to be mounted. A transferring mechanism is provided for successively feeding the fuses held by the parts-holding member through an outlet of the parts-holding member. The apparatus also includes a pair of holding members. The holding members are provided at opposite sides of the fuse at the outlet in such a manner as to be opened and closed with respect to each other for receiving the fuses fed by the transferring mechanism and to mount the fuses in the box. At least one pair of locking portions are provided on the pair of holding members so as to be opposed to each other. The locking portions have a step like shape comprised of a recessed upper portion and a projecting lower portion, and correspond to the plurality of fuses. Projections formed at upper portions of side surfaces of the fuses can be placed on the projecting lower portions when the holding members are closed with respect to each other. The apparatus further comprises a vertically displacing mechanism for vertically displacing the pair of holding members between an upper position where the holding members face the outlet of the parts-holding member and a lower position corresponding to a state where the fuse is mounted in the box.

With this construction, the fuse fed through the outlet by the transferring mechanism is received between the pair of holding members and is held by being placed on the pair of locking portions corresponding to the particular type of fuse. The fuse can be mounted in the box when the holding members are displaced downward by the vertically displacing mechanism.

The holding members are constructed such that the projections of the fuse are placed on the locking portions with the holding members closed. Hence, it is sufficient to form the locking portions that are spaced apart by a specified distance. Thus, as compared to a case where the fuse is clamped, a construction for holding the fuse can be simplified.

Since both the parts-holding member and the pair of holding members can handle a plurality of kinds of fuses, it is sufficient to provide one each of the parts-holding member, the pair of holding members, and other associated mechanisms including the vertically displacing mechanism. Therefore, the inventive assembling apparatus can be made smaller than the conventional assembling apparatuses, which require a plurality of each of the above members and mechanisms.

The pair of holding members may further comprise a pair of first facing members that are coupled to the vertically displacing mechanism and that can be opened and closed with respect to each other. A pair of second facing members is provided at the opposite sides of the pair of first facing members, and can be opened and closed with respect to each other. The pair of second facing members is vertically displaceable with respect to the pair of first facing members. An engaging mechanism also may be provided for engaging the first and second facing members so as to restrict a relative displacement of the first and second facing members. The engaging mechanism includes a pair of slanted surfaces, which are provided between the first and second facing members and can be held in sliding contact with each other. The first and second facing members can be displaced as a unit by holding the pair of slanted surfaces in contact with each other while preventing their relative sliding movements. Displacing the first and second facing members with respect to each other while causing the pair of slanted surfaces to slide along each other can open the second facing members. The first and second facing members further may have a pair of locking portions. The locking portions of the first facing member are located above those of the second facing member and are spaced more narrowly apart than those of the second facing member.

With this construction, the respective pairs of locking portions can be arranged easily using the pair of locking portions of the second facing members for large-size fuses while using those of the first facing members for small-size fuses.

By holding the slanted surfaces of the engaging mechanism in contact with each other while preventing their relative sliding movements, the first and second facing members can be displaced downward as a unit and the corresponding fuses can be inserted into the box using the respective pairs of locking portions. At this time, when the fuse locked by the locking portions of the second facing members is inserted into the box, the second facing members are subjected to an upwardly acting reaction force, and the first and second facing members are displaced vertically with respect to each other while the slanted surfaces slide along each other. Accordingly, the second facing members can be opened automatically to release the fuse. Further, if the first and second facing members are displaced vertically with respect to each other when the fuse that is locked by the locking portions of the first facing members is inserted into the box, only the first facing members can be displaced downward while opening the second facing members. As a result, the second facing members are unlikely to be a hindrance.

Most preferably, in the fuse box assembling apparatus, the locking portions have slanted surfaces, which are slanted downward in facing directions, on its portion where the part or fuse is placed. With this construction, if the holding members are displaced upward after the fuse is mounted in the box, the slanted surfaces of the locking portions automatically are spaced apart more widely along the mounted fuse to release the fuse without displacing this fuse.

According to the invention, there is further provided a box assembling method for mounting a plurality of kinds of electric/electronic parts, preferably of fuses, having different configurations in or on or at a receiving member, such as a box or an electric or electronic board. The method comprises holding a plurality of parts necessary to assemble a receiving member with a parts holding member while substantially arranging them in an order in which they are to be mounted. The method further comprises successively feeding the plurality of parts held by the parts holding member by means of a transferring mechanism through an outlet of the parts holding member. The method then includes receiving the parts fed by the transferring mechanism by means of a pair of holding members. The holding members are provided at substantially opposite sides of the part at the outlet in such a manner as be opened and closed with respect to each other to mount the parts in the receiving member. The method continues by vertically displacing the pair of holding members by using a vertically displacing mechanism between an upper position where the holding members substantially face the outlet of the parts holding member and a lower position corresponding to a state where the part is at least partly mounted in the receiving member.

The holding members may be opened to discharge the part in the receiving member. Additionally, the holding members may be displaced vertically while being substantially closed to at least partly mount the part in the receiving member.

The part preferably is mounted at least partly with the first holding members substantially closed. The part then is discharged by opening the second holding members, and is pushed from above, by vertically displacing the first holding members.

These and other objects, features and advantages of the present invention will become apparent upon a reading of the following detailed description and accompanying drawings.

DETAILED DESCRIPTION OF THE PREFERRED EMBODIMENTS

The embodiment of the invention that is described in detail with reference to the accompanying drawings is an apparatus for mounting fuses in a fuse box. However, it should be understood that the invention may be applied to apparatus and methods for mounting other electric and/or electronic parts in a receiving member, such as a box or an electric or electronic board. It also should be noted that arrows X, Y and Z are used consistently throughout the drawings to indicate a forward/backward direction, a transverse direction and a vertical direction, respectively.

Figure 1:
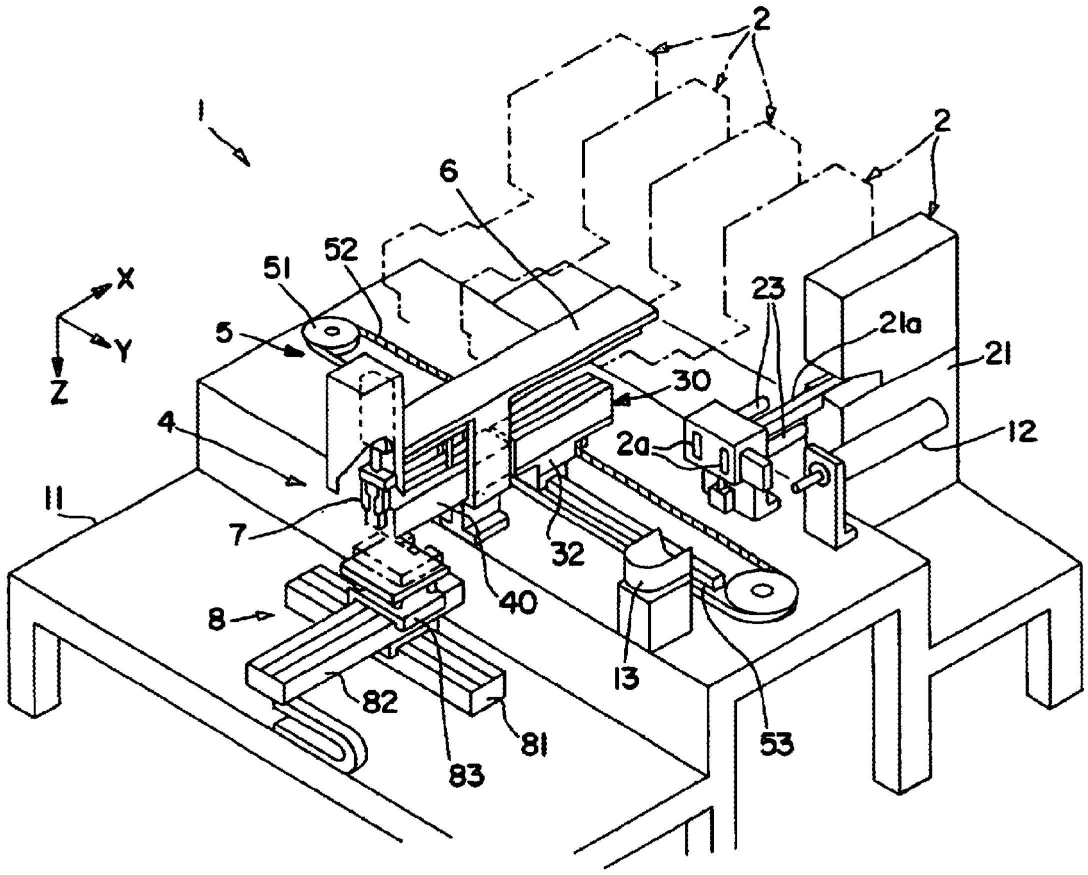
FIG. 1 is a perspective view of a fuse box assembling apparatus according to one embodiment of the invention.

A fuse box assembling apparatus in accordance with the subject invention is identified generally by the numeral 1 in FIG. 1. The assembling apparatus 1 is configured for mounting fuses of different sizes and configurations in a box. However, the assembling apparatus 1 can be used with other electric and/or electronic parts or devices, such as capacitors, relays, resistors, transistors, wires, wiring boards, bus bars, chips and other such parts or devices that may be mounted in the box.

Figure 10:
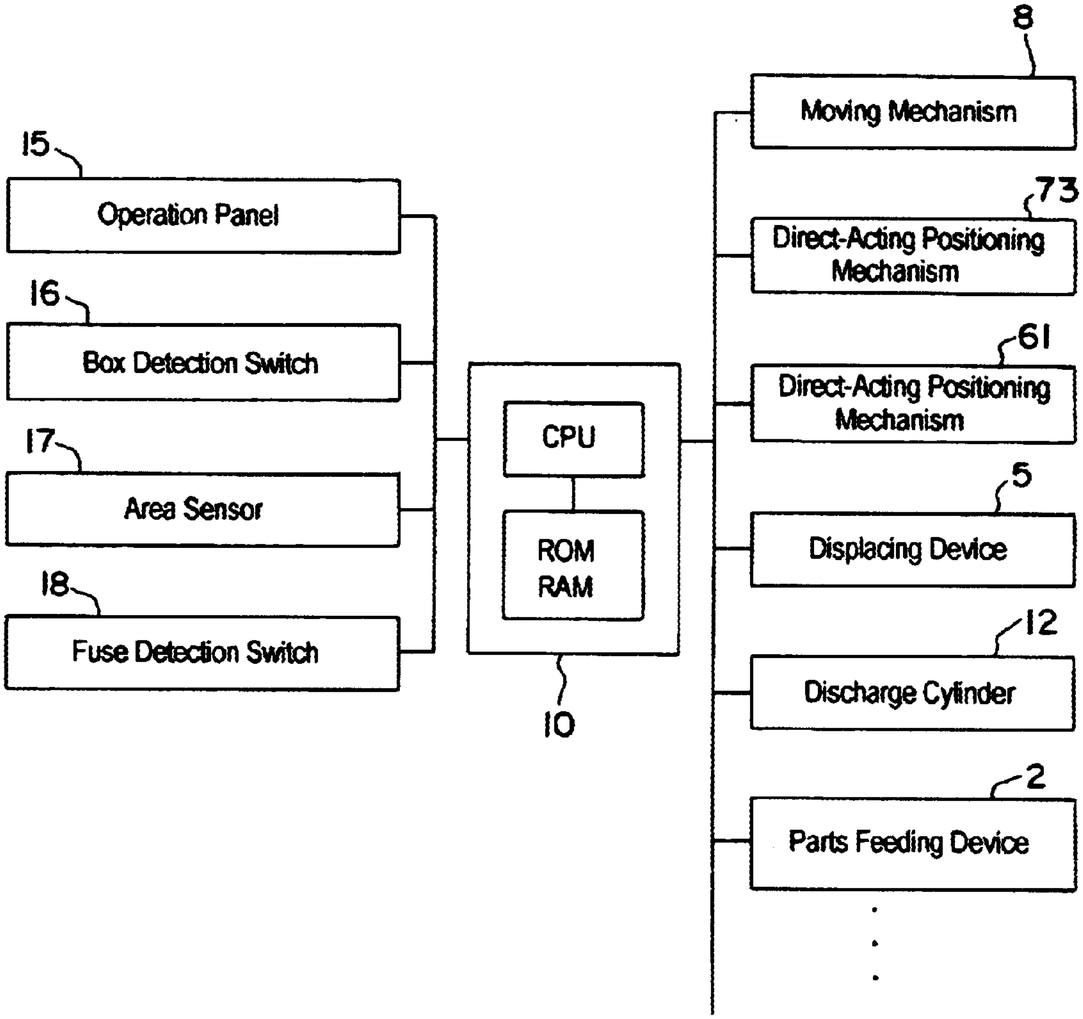
FIG. 10 is a block diagram of a controller of the fuse box assembling apparatus of FIG. 1.

The assembling apparatus 1 has a plurality of parts-feeding units 2 and a movable magazine 30. The parts-feeding unit 2 feeds fuses at a specified timing. The movable magazine 30 can be moved to receive the fuses from the parts-feeding units 2 and holds a plurality of the received fuses. A mounting unit 4 is provided for transferring the fuses from the movable magazine 30 to a fixed magazine 40 and for successively mounting the transferred fuses in a box by means of an inserting mechanism 7. The assembling apparatus 1 also includes a moving unit 5 for moving the movable magazine 30 to the mounting unit 4 so that the fuses from the respective parts-feeding units 2 can be transferred to the mounting unit 4. A controller 10 is shown in FIG. 10, and controls the aforementioned units and the inserting mechanism 7. The aforementioned units and the inserting mechanism 7 are mounted on a frame 11. A discharge cylinder 12 for discharging the fuses from the movable magazine 30 and a container 13 for containing the fuses discharged from the discharge cylinder 12 also are mounted on the frame 11.

The respective parts-feeding units 2 are arranged substantially side by side at a lateral or rear part of the frame 11. Additionally, the respective parts-feeding units 2 are arranged substantially transversely to a main direction of a moving mechanism 8, as described further below. Each parts-feeding unit 2 has outlets *2a* in two positions. The outlets *2a* open forwardly, and are transversely juxtaposed at substantially the same height. Aligned fuses are fed along a transport rail *21a* from a parts-feeder 21 in each parts-feeding unit 2. The fuses then are pushed out one by one through one of the outlets *2a*. A space for displacing the movable magazine 30 is provided right in front of the respective outlets *2a*.

The displacing unit 5 includes, for example, a toothed pulley driven by a stepped motor, a toothed belt 52 meshed with the toothed pulley 51, a connecting member 54 drivingly coupled to the toothed belt 52, and a direct-acting bearing 53 for guiding the connecting member 54, thereby constructing a direct-acting positioning mechanism. The displacing unit 5 moves the movable magazine 30 to a location in front of an outlet *2a* of a selected parts-feeding unit 2. One fuse then is pushed out through the outlet *2a* to enter the movable magazine 30 through an inlet at the facing or rear end of the movable magazine 30. Subsequently, the movable magazine 30 is displaced to stop in front of an outlet *2a* of another parts-feeding unit 2. Another fuse then enters the movable magazine 30 through an outlet *2a* of this other parts-feeding unit 2, thereby pushing the fuse already in the movable magazine 30 forward. The above-described operations are repeated in a predetermined sequence for the respective fuses, such that a plurality of fuses necessary to assemble one fuse box are held in the movable magazine 30. Additionally, the fuses are aligned substantially in a line along a forward/backward direction in a specified order within the movable magazine 30.

Necessary fuses are collected in the movable magazine 30, as explained above. More particularly, the movable magazine 30 is displaced such that the outlet at the front end of the movable magazine 30 faces or substantially corresponds to an inlet at the rear end of the fixed magazine 40 of the mounting unit 4. The necessary fuses then are transferred from the movable magazine 30 to the fixed magazine 40 by a transferring mechanism 6 of the mounting unit 4 while maintaining their order of alignment. This movement of the fuses is in a forward direction, which is the direction opposite from the direction X in FIG. 1.

Fuses in the mounting unit 4 are fed successively through the outlet at the front end of the fixed magazine 40 by the transferring mechanism 6, and are inserted into the box by the inserting mechanism 7. Simultaneously, the box is positioned in a specified location along the horizontal direction by a moving unit 8. In this way, the respective fuses can be inserted in the specified positions of the box. The box is pulled to a detachment position at front by the moving unit 8 when the insertion of the necessary fuses is completed, and is replaced by a box to be assembled next.

In this embodiment, the fuses necessary to assemble a next box are collected in the movable magazine 30 while the fuses are inserted into the box being assembled by the mounting unit 4. Thus, a tact time or cycle time required for assembling can be shortened.

This embodiment is designed to make the assembling apparatus smaller and to enable the insertion of a plurality of differently configured fuses into a box by the fixed magazine 40 of the mounting unit 4 and by a pair of holding members 70 of the inserting unit 7.

Hereafter, the respective units or elements are described in detail.

Figure 2:
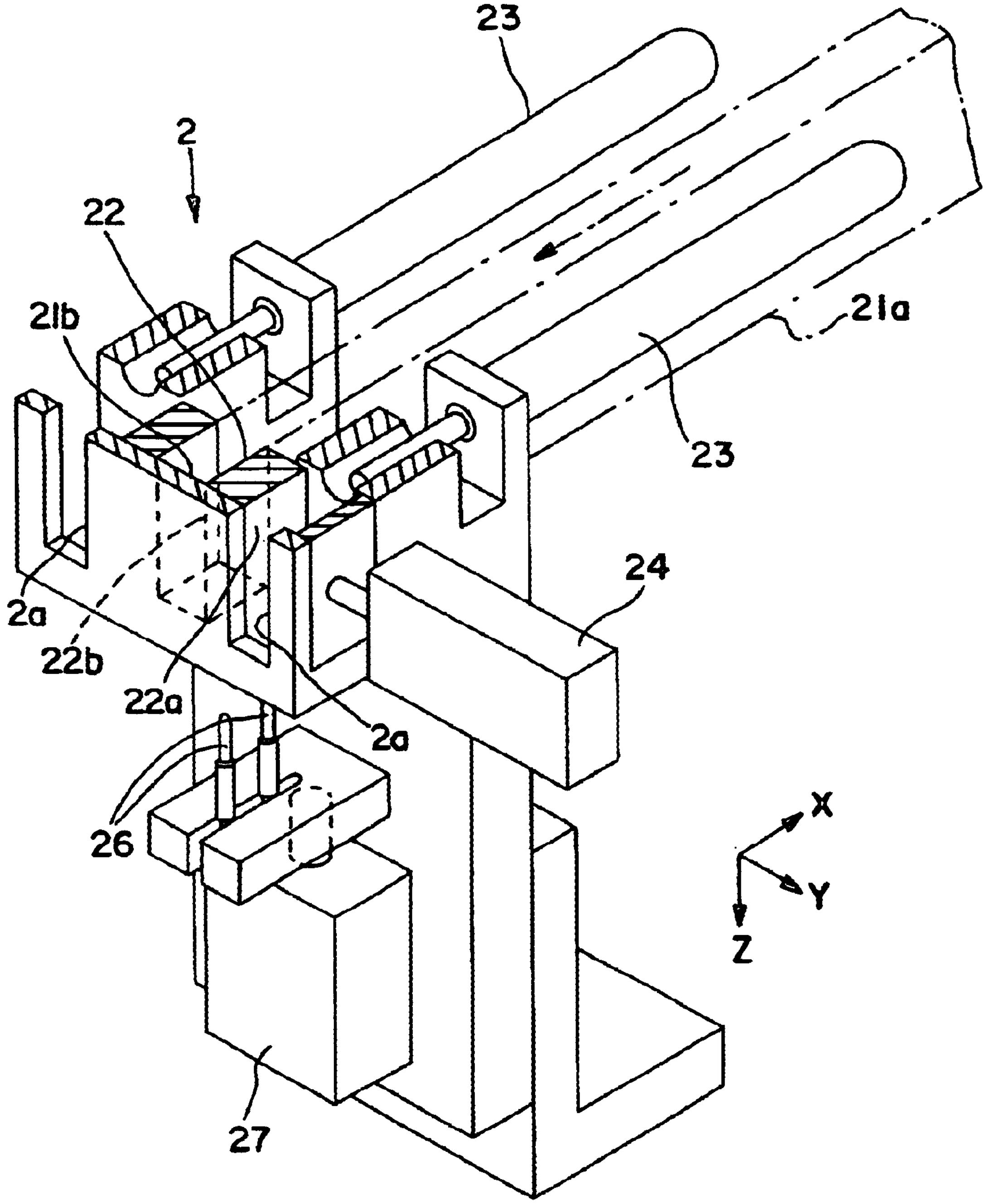
FIG. 2 is a perspective view of a parts feeding unit shown in FIG. 1.

As shown in FIGS. 1 and 2, each parts-feeding unit 2 includes a parts-feeder 21, an accommodating member 22 and two cylinders 23. The parts-feeder 21 feeds the fuses and/or the electric/electronic parts along a transport rail *21a*, while successively aligning them in a predetermined orientation. The accommodating member 22 is provided at the rear end of the transport rail *21a* for receiving and accommodating the fuses that are to be moved to either one of the outlets *2a*, and the two cylinders 23 feed the fuses out through the respective outlets *2a*. Fuse accommodating chambers *22a*, *22b* are arranged substantially side-by-side in the accommodating member 22, and each accommodating chamber *22a*, *22b* at least partly accommodates one fuse. The accommodating member 22 can be moved transversely by a cylinder 24, so that the fuse accommodated in the right fuse accommodating chamber *22a* can be moved to the right outlet *2a* while the fuse accommodated in the left fuse accommodating chamber *22b* can be moved to the left outlet 2*a*. A testing device (not shown) is provided for testing the fuse held at the rear end of the transport rail 21*a*. More particularly, a cylinder 27 moves a probe 26 into contact with the fuse and/or the electric/electronic part, and the testing device tests whether or not the fuse is electrically conductive or whether the corresponding electric/electronic part is correctly functioning.

The fuse moves along the transport rail 21*a* and into engagement with a contact surface 21*b* of the parts-feeding unit 2. The fuse then is arranged by the accommodating member 22 to substantially face one of the outlets 2*a*. The cylinder 23 is disposed behind the fuse. If the above-described test is satisfactory, the cylinder 23 pushes the fuse that faces the outlet 2*a*. The pushing by the cylinder 23 is in synchronism with the timing of the movable magazine 30 relative to the outlet 2*a*. As a result, the fuse enters the movable magazine 30 that substantially faces the outlet 2*a*.

Figure 3:
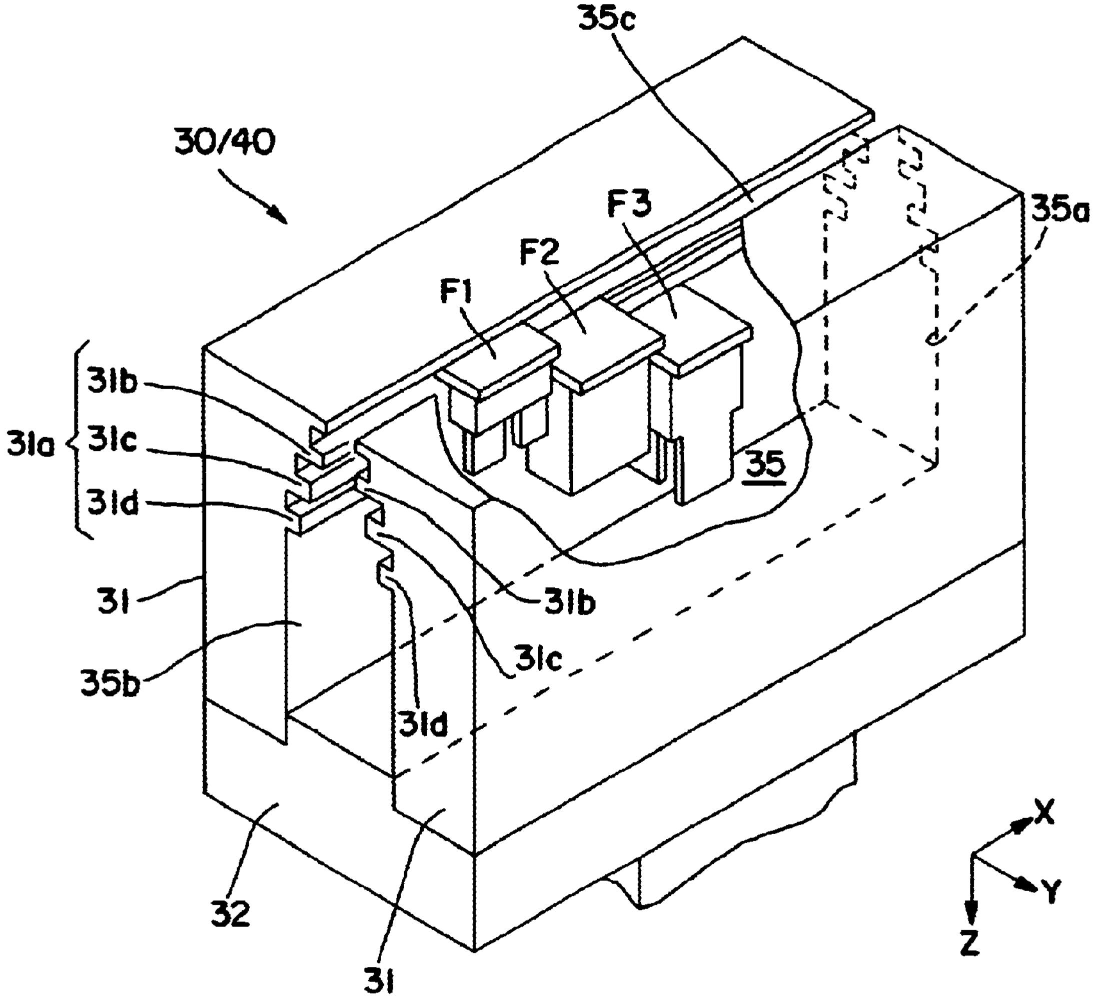
FIG. 3 is a perspective view of a movable magazine and/or fixed magazine shown in FIG. 1.
Figure 4:
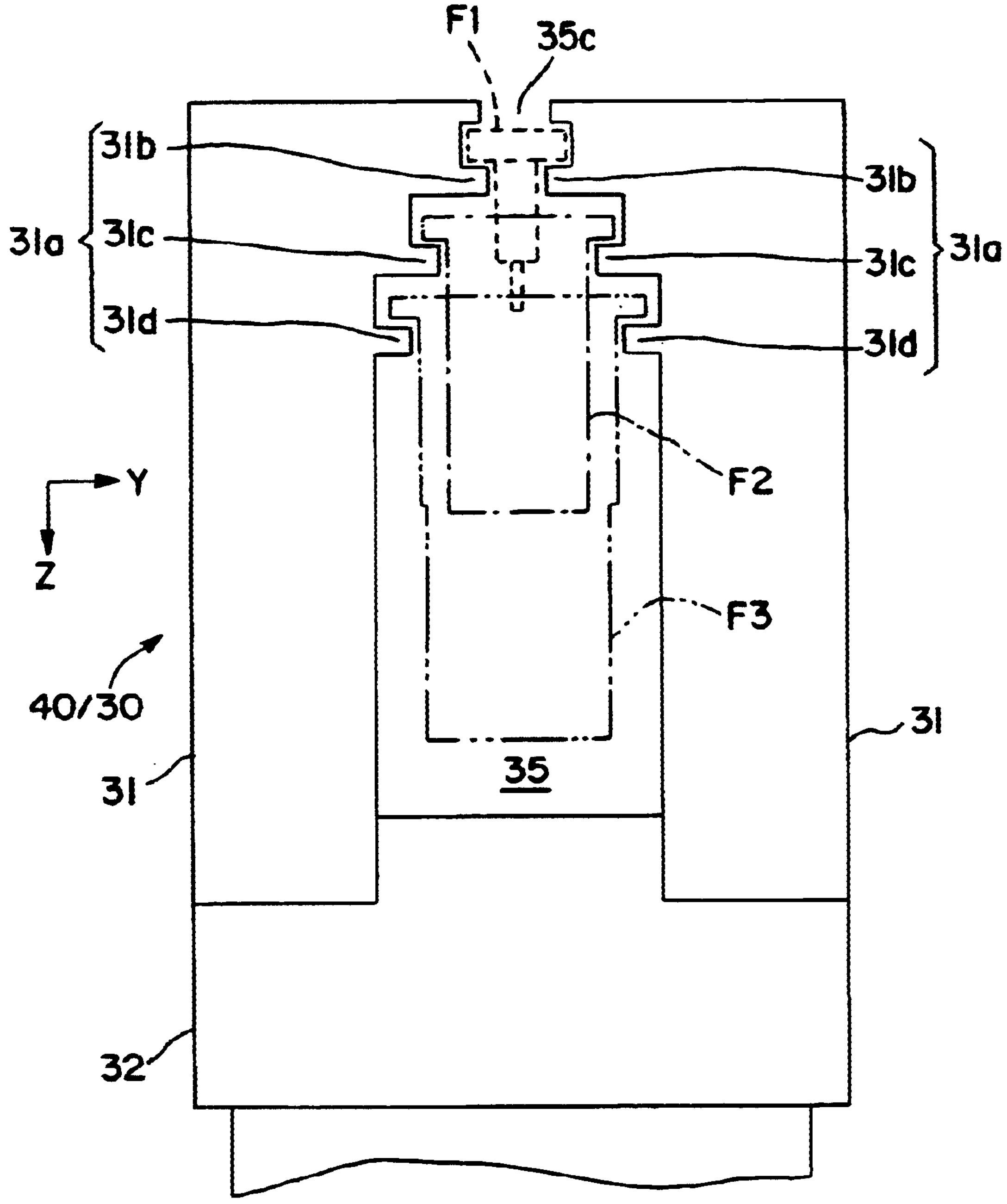
FIG. 4 is a front view of the movable magazine and/or fixed magazine shown in FIG. 1.

As shown in FIGS. 3 and 4, the movable magazine 30 and/or the fixed magazine 40 include(s) a pair of facing members 31 and a connecting member 32. The connecting member 32 connects the bottom ends of the facing members 31. The facing members 31 are arranged substantially side by side, and a holding chamber 35 is defined between the facing members 31 for holding the fuses. The holding chamber 35 is dimensioned to accommodate a specified number of fuses, and holds fuses having different configurations in alignment along a forward/backward direction. The fuses are necessary to assemble a fuse box and are aligned in an order that they are to be mounted in the box. A guide surface 31*a* is formed at a portion of each facing member 31 and defines an inner surface of the holding chamber 35. An inlet 35*a* is open at the rear end of the holding chamber 35, and the fuses can enter the holding chamber 35 through the inlet 35*a* and be moved along the guide surfaces 31*a*. An outlet 35*b* is open at the front end of the holding chamber 35, and the fuses can be taken out from the holding chamber 35 through the outlet 35*b*. An upper part of the holding chamber 35 is open to define a passage 35*c* along which a pushing member 64 (see FIG. 5) of the transferring mechanism 6 of the mounting unit 4 can pass.

Each guide surface 31*a* comprises a plurality of elongated projections, and, in the illustrated embodiment of FIGS. 3 and 4, each guide surface 31*a* comprises three elongate projections 31*b*, 31*c* and 31*d*. Opposed pairs of the elongated projections 31*b*, 31*c* and 31*d* correspond to different kinds of fuses and restrict the orientation of the fuses located between the respective pairs of elongate projections 31*a*, 31*c* and 31*d*. The upper surfaces of the elongated projections 31*b*, 31*c* and 31*d* in each pair engage outwardly projecting flanges at the tops of the respective fuses, and thus hold the respective fuses. The uppermost-elongated projections 31*b* are most narrowly spaced and are used for small-size fuses F1. The elongated projections 31*c* below the elongated projections 31*b* are used for middle-size fuses F2. The lowest elongated projections 31*d* are spaced more widely apart and are used for large-size fuses F3. Each of the respective elongated projections 31*b*, 31*c* and 31*d* may handle a plurality of kinds of fuses provided that those fuses can be guided by the elongated projections.

Fuses inserted through the inlet 35*a* are aligned along the guide surfaces 31*a* in a specified order, and preferably overlap and/or contact each other. Accordingly, if the rear end of the row of the fuses in the holding chamber 35 is pushed, the fuses are pushed successively forward and are guided in the above order to the outlet 35*b*.

The displacing unit 5 is provided with a direct-acting positioning mechanism, as shown in FIG. 1, for transversely moving the connecting member 32 of the movable magazine 30 to a specified position. A known construction may be employed for this direct-acting positioning mechanism. For example, this known construction may include a toothed pulley 51 which can be driven by a stepping motor and a toothed belt 52, which can be meshed with the toothed pulley 51. The toothed belt 52 may be coupled to and driven by the connecting member 32, which, in turn, is guided transversely by a direct-acting bearing 53.

The displacing unit 5 displaces the movable magazine 30 to the respective feeding positions, which are set in, front of the respective outlets 2*a*. Thus, fuses can be fed from the respective parts feeding units 2 to the movable magazine 30. A receiving position is set right behind the fixed magazine 40, as shown in FIG. 1, so that the mounting unit 4 can receive the fuse from the movable magazine 30. A discharging position is defined where the discharge cylinder 12 discharges the fuses in the movable magazine 30 into the container 13.

The mounting unit 4 is provided with the fixed magazine 40, the transferring mechanism 6, the inserting mechanism 7 and the moving mechanism. The transferring mechanism 6 functions as a holding means for receiving and holding the fuses from the movable magazine 30 displaced to the receiving position by the displacing unit 5. The transferring mechanism 6 transfers a plurality of fuses from the movable magazine 30 to the fixed magazine 40 at one time and intermittently feeds the fuses preferably one by one in the fixed magazine 40. The inserting mechanism 7 for inserting the fuses fed by the transferring mechanism 6 into the box, and the moving mechanism 8 for moving the box with respect to the inserting mechanism 7.

Fuses are received in the mounting unit 4 by the transferring mechanism 6, and are mounted or connected successively in the box by the transferring mechanism 6 and the inserting mechanism 7.

The fixed magazine 40 has substantially the same construction as the movable magazine 30 except that it is secured to the frame 11. Accordingly, portions of the fixed magazine 40 that are similar to the movable magazine 30 are identified by the same reference numerals, but are not described again. In particular, the fixed magazine 40 and the movable magazine 30 have substantially the same construction and substantially the same inner cross section when viewed from front. Additionally, the fixed magazine 40 and the movable magazine 30 both are formed with an inlet and outlet for the fuses at their respective front and rear ends. The fixed magazine 40 is secured to the frame 11, whereas the movable magazine 30 can be moved by the displacing unit 5. Specifically, the fixed magazine 40 includes a pair of facing members 31, a holding chamber 35 defined between the facing members 31, guide surfaces 31*a* in the holding chamber 35, an inlet 35*a* at the rear end of the holding chamber 35 and an outlet 35*b* at the front end of the holding chamber 35. A plurality of fuses with different configurations can be positioned substantially in a line in the holding chamber 35. These fuses are those necessary to assemble the fuse box, and preferably are held in an order that they are to be mounted in the box.

Figure 5:
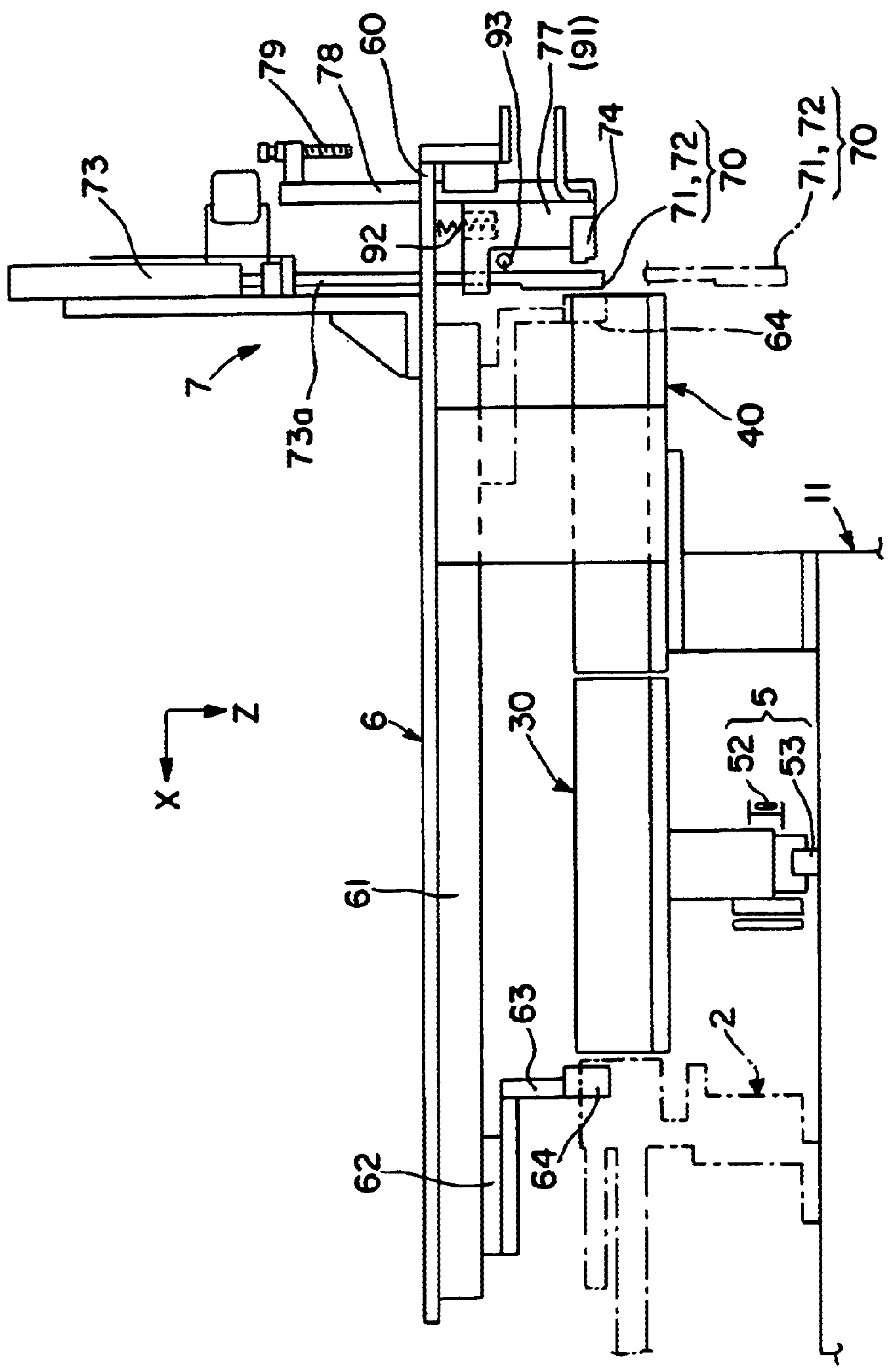
FIG. 5 is a side view of an inserting mechanism and the movable magazine and/or fixed magazine shown in FIG. 1.

As shown in FIG. 5, the transferring mechanism 6 includes a movable member 62 and a pushing member 64. The movable member 62 is provided substantially above the fixed magazine 40 and is moved and positioned along the forward/backward direction X by a direct-acting positioning mechanism 61. The pushing member 64 is coupled drivingly to the movable member 62 via a support column 63 for pushing the fuses.

The direct-acting positioning mechanism 61 may employ a known construction. For example, the direct-acting positioning mechanism 61 may include a direct-acting shaft movably supporting the movable member 62 along the forward/backward direction, a ball screw driven by a servomotor or a ball nut screwed onto the ball screw. The above movable member 62 may be coupled drivingly e.g. to this ball nut.

The pushing member 64 is movable in a range defined between the front end of the fixed magazine 40 (the pushing member 64 in this state is shown in phantom in FIG. 5) and a position behind the rear end of the movable magazine 30. The pushing member 64 then passes through the respective holding chambers 35 of the movable magazine 30 and the fixed magazine 40 during its movement to push forward the fuses in the holding chamber 35.

In the fuse receiving operation, the pushing member 64 is positioned at the rear end of its movable range (shown in solid line in FIG. 5) before the movable magazine 30 is located at the receiving position. When the movable magazine 30 stops at the receiving position, the pushing member 64 is moved forward to push the rear end of the row of the fuses in the movable magazine 30. The fuses are moved forward along the guide surfaces 31*a* of the movable magazine 30 and/or of the fixed magazine 40 while being substantially aligned in a line. The fuses then are transferred to the holding chamber 35 of the fixed magazine 40 through the inlet 35*a* of the fixed magazine 40. The pushing member 64 enters the fixed magazine 40 preferably to the degree that it does not hinder the movement of the movable magazine 30.

The fuse transferring operation follows the fuse receiving operation. More particularly, the pushing member 64 pushes the rear end of the row of the fuses in the fixed magazine 40 and causes the front end of the row of the fuses to reach the outlet 35*b* of the fixed magazine 40. At that time, the pushing member 64 is stopped. No fuse is at the outlet 35*b* of the fixed magazine 40 while the fuse is inserted by the pushing mechanism 7. Upon reaching a time for the preparation of the next fuse after completing the insertion by the inserting mechanism 7, the pushing member 64 is moved forward by a specified distance to push the fuse to the outlet 35*b* of the fixed magazine 40. The above operation is continued until no more fuses are present in the fixed magazine 40. Here, the above specified distance is set according to the size of the fuse inserted by the inserting mechanism 7. Preferably, the fuse transferring operation and/or the fuse transferred to the inserting mechanism 7 is controlled by means of a monitoring camera (not shown). The monitoring camera preferably monitors the shape, size and/or color of the parts (e.g. the fuses) to be mounted in or on the box or other such receiving member.

A positioning member 74 is provided to substantially face the outlet 35*b* of the fixed magazine 40. This positioning member 74 positions the fuse with respect to the forward/backward direction X by having the fuse brought into contact with the rear surface thereof. The rear surface of the positioning member 74 preferably is stepped such that an upper portion bulges more backward than a lower portion. The upper portion is brought into contact with the small-size fuse from the outlet 35*b* to locate the fuse in a specified position where the fuse is to be received by the inserting mechanism 7. Further, the lower portion is brought into contact with the middle or large-size fuse from the outlet 35*b* to locate that fuse in a specified position so as to be received by the inserting mechanism 7.

The inserting mechanism 7 includes a pair of holding members 70 and a direct-acting positioning mechanism 73. The holding members 70 at least partly receive and hold the fuse from the outlet 35*b* of the fixed magazine 40. The direct-acting positioning mechanism 73 functions as a vertically displacing mechanism for vertically displacing the pair of holding members 70 or for displacing the holding members 70 relatively to the box B so as to mount the fuse held between the holding members 70 in the box.

The direct-acting positioning mechanism 73 includes, for example, an air cylinder and is capable of vertically moving an output shaft 73*a* of the air cylinder to locate it in a specified position in accordance with a signal from a position detector. With the output shaft 73*a* located in an upper position, which is preferably an upper limit of its movable range, the fuse is transferred from the outlet 35*b* to the pair of holding members 70.

Figure 6:
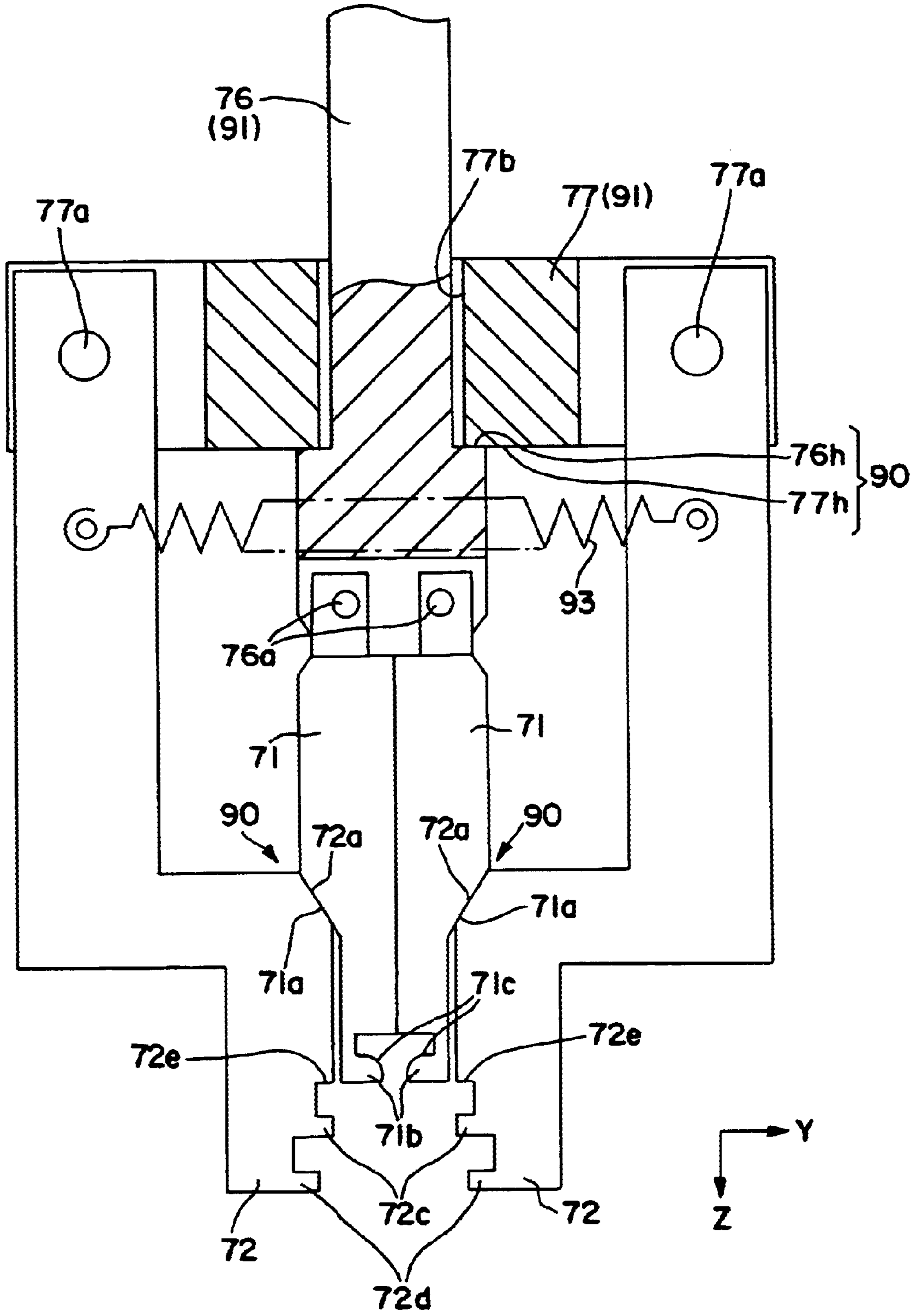
FIG. 6 is a front view showing an essential portion of the inserting mechanism shown in FIG. 1.
Figure 7D:
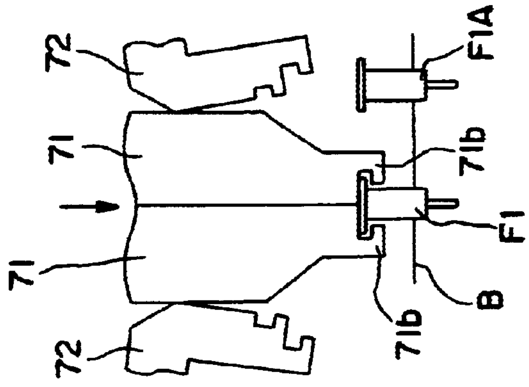
FIGS. 7(*a*) to 7(*d*) are diagrams showing an operation sequence of the inserting mechanism shown in FIG. 6 when a small-size fuse is inserted.
Figure 7C:
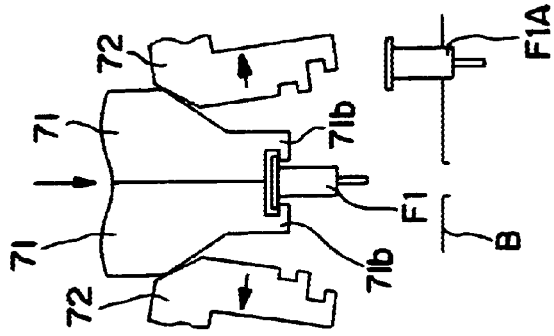
Figure 7B:
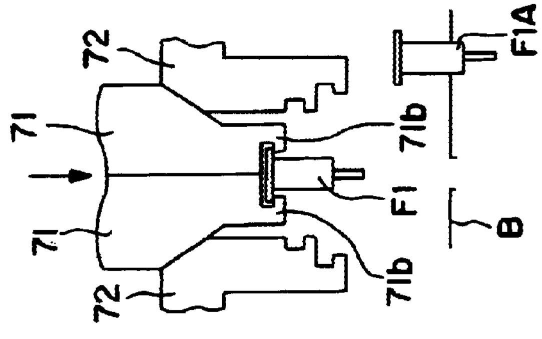
Figure 7A:
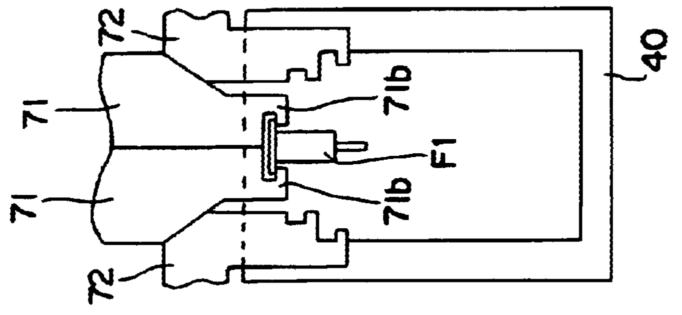
Figure 8A:
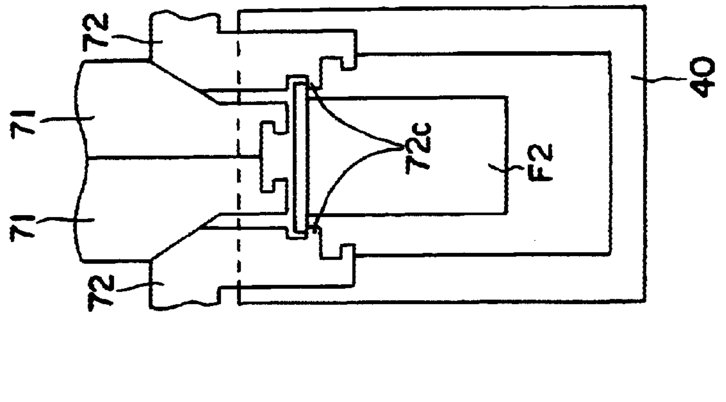
FIGS. 8(*a*) to 8(*d*) are diagrams showing an operation sequence of the inserting mechanism shown in FIG. 6 when a middle-size fuse is inserted.
Figure 8B:
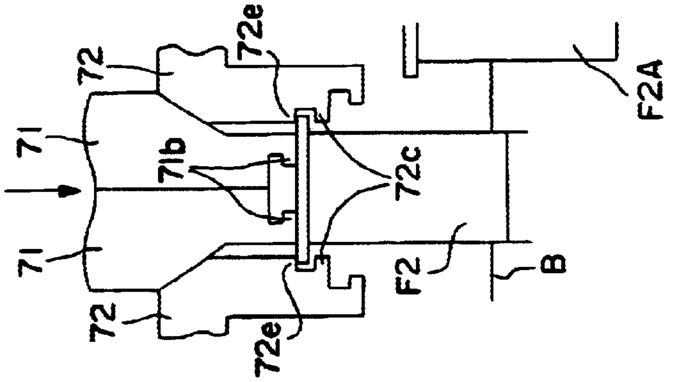
Figure 8C:
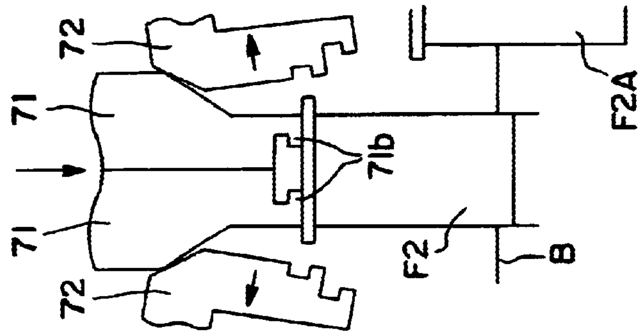
Figure 8D:
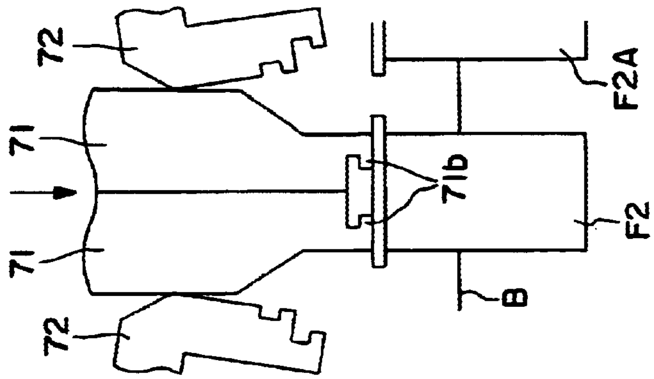
Figure 9A:
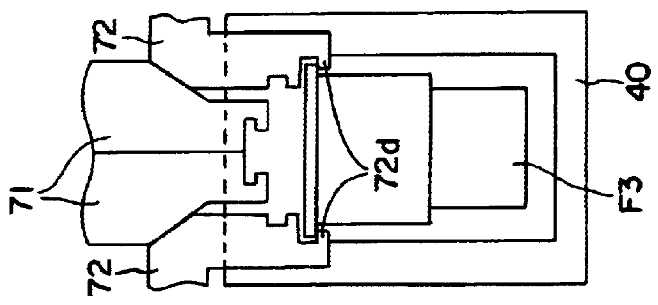
FIGS. 9(*a*) to 9(*d*) are diagrams showing an operation sequence of the inserting mechanism shown in FIG. 6 when a large-size fuse is inserted.
Figure 9B:
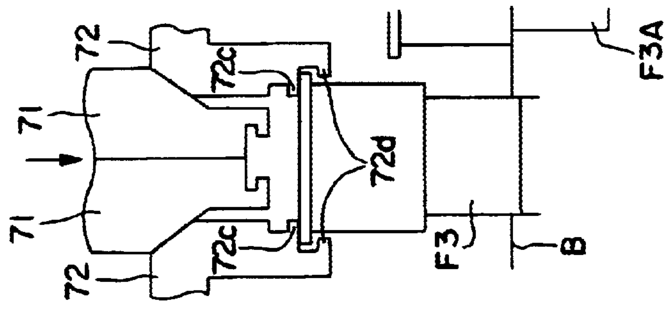
Figure 9C:
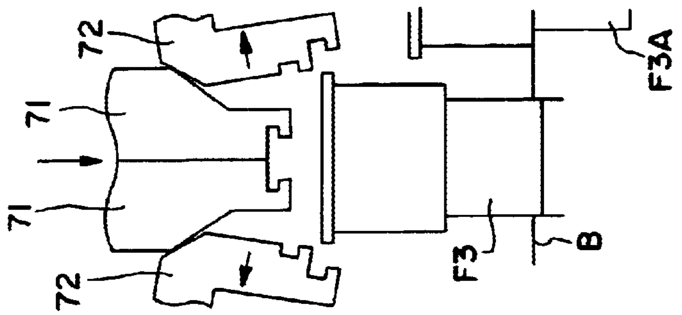
Figure 9D:
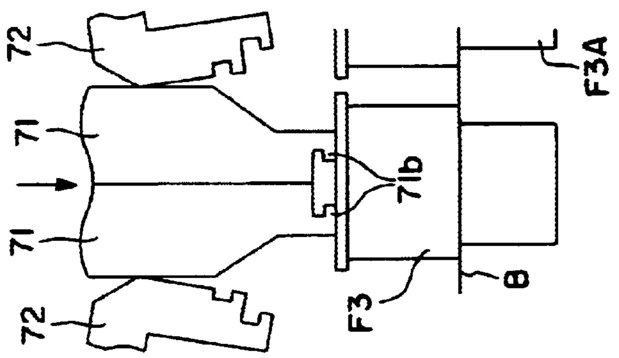

The pair of holding members 70 include, as shown in FIG. 6, first claws 71, second claws 72, engaging mechanisms 90 and a linking mechanism 91. The first claws 71 function as a pair of first facing members, while the second claws 72 function as a pair of second facing members. The engaging mechanisms 90 selectively engage and disengage the first and second claws 71, 72, and the linking mechanism 91 links the first claws 71 and the second claws 72 such that they can open and close with respect to each other. The first claws 71 are held between the second claws 72.

The linking mechanism 91 is comprised of first and second linking members 76 and 77. The first linking member 76 links the upper ends of the first claws 71 and supports the first claws 71 for rotation or pivoting about shafts 76*a*. The second linking member 77 links the upper ends of the second claws 72 and supports the second claws 72 for rotation or pivoting about shafts 77*a*.

The first linking member 76 is relatively vertically displaceable along a hole or recess 77*b* formed in the second linking member 77. Further, the first linking member 76 is drivingly coupled to the output shaft 73*a* of the direct-acting positioning mechanism 73.

As shown in FIG. 5, the second linking member 77 is supported for vertical displacement on a direct-acting bearing 78, and has the upper limit of its vertical displacement range restricted by the contact of a restricting member 79 fixed to one end thereof with a fixed member 60. The second linking member 77 is biased downward by a compression spring 92.

The engaging mechanism 90, as shown in FIG. 6, is comprised of a lower surface 77*h* of the second linking member 77 and a stepped surface 76*h* of the first linking member 76 which are substantially held in sliding contact with each other. Pairs of slanted surfaces 71*a*, 72*a* are formed respectively on the first and second claws 71, 72 and are held in contact with each other. An engaged state is achieved with both the first claws 71 and the second claws 72 closed. A tension spring 93 is mounted between the second claws 72 to bias the second claws 72 closer to each other. The interaction of the second claws 72 with the first claws 71 causes the biasing force of the tension spring 93 to be transmitted to the first claws 71, and hence causes the first claws 71 to be moved toward each other, and preferably substantially toward a closed position. Alternatively, or additionally, leaf springs (not shown) may be provided between the first linking member 76 and the first claws 76 to bias the first claws 71 toward a substantially closed position.

In the engaged state, the output shaft 73*a* of the direct-acting positioning mechanism 73 is drivingly coupled to the second claws 72 via the first claws 71 and the engaging mechanism 90, and the respective members are displaced as a unit. At this time, the engaged state is maintained by the elastic force of the tension spring 93.

In the engaged state, the pairs of slanted surfaces 71*a*, 72*a* are held in contact with each other without sliding along each other. Additionally, the output shaft 73*a* of the direct-acting positioning mechanism 73 is coupled drivingly to the second claws 72 via the first claws 71 and the engaging mechanism 90. Accordingly, the first and second claws 71, 72 are displaced as a unit and in a closed condition. At this time, the engaged state is maintained by the elastic force of the tension spring 93. The engaged state can be released to open the second claws 72 by relatively displacing the first and second claws 71, 72 while causing the pairs of the slanted surfaces 71*a*, 72*a* to slide along each other.

The displacement of the second claws 72 can be restricted when the first claws 71 are displaced downward. Thus the first claws 71 open the pair of second claws 72 more widely against the elastic force of the tension spring 93, while the slanted surfaces 71*a*, 72*a* of the engaging mechanism 90 slide along each other, thereby releasing the engaged state. As a result, only the first claws 71 are displaced further downwardly with the pair of second claws 72 opened apart.

Conversely, if the first claws 71 are displaced upward with the engaged state released, the engaged state is achieved again when the lower surface 77*h* of the second linking member 77 and the stepped surface 76*h* of the first linking member 76 come into contact with each other. As a result, the first claws 71 and the second claws 72 are moved upward together.

The holding members 70 are formed with a plurality of pairs, e.g. three pairs, of projections 71*b*, 72*c* and 72*d* corresponding to the configurations of a plurality of kinds of fuses. Each projection is preferably in the form of a step having a recess above the step. With the pair of holding members 70 substantially closed, the respective pairs of projections 71*b*, 72*c* and 72*d* face substantially opposite sides of the fuses and lock the fuses by their upper surfaces or hold the fuses by placing the flanges of the fuses on their upper surfaces. The plurality of pairs of projections 71*b*, 72*c* and 72*d* are arranged one after another along vertical direction, and the space between the upper pair of projections is narrower than the one between the lower pair of projections.

The projections 71*b* are formed on the first claws 71, and are located in the uppermost positions among the three pairs of projections. Additionally, the projections 71*b* are spaced apart by substantially the same distance as the elongated projections 31*b* of the fixed magazine 40 for locking the upper ends of the small-size fuses F1. Slanted surfaces 71*c* are formed on the upper surfaces of the projections 71*b* for locking the fuses. The slanted surfaces 71*c* are curved and slant down along the facing directions of the projections 71*b*.

The projections 72*c* are formed on the second claws 72, and are provided between the other two pairs of projections 71*b*, 72*d* along a vertical direction. The projections 72*c* are spaced apart by substantially the same distance and cross section as the elongated projections 31*c* of the fixed magazine 40 for locking the upper ends of the middle-size fuses F2.

The projections 72*d* are formed on the second claws 72, and are provided in the bottommost positions among the three pairs of projections 71*b*, 72*c* and 72*d*. The projections 72*d* are spaced apart by substantially the same distance and cross section as the elongated projections 31*d* of the fixed magazine 40 for locking the upper ends of the large-size fuses F3.

The respective pairs of projections 71*b*, 72*c* and 72*d* preferably are provided in positions to avoid an interference with the fuses locked by the other pairs of projections. For instance, the projections 71*b* are located above the fuses F2, F3 locked by the projections 72*c*, 72*d*, and, thus, do not contact the fuses F2 or F3. The projections 72*c* are located transversely more outward than the fuse F1 locked by the projections 71*b* while being located above the fuse F3 locked by the projections 72*d*. Thus, the projections 72*c* do not contact the fuses F1 or F3. Further, the projections 72*d* are located transversely more outward than the fuses F1, F2 locked by the projections 71*b*, 72*c*, and thus do not contact the fuses F1 or F2.

The insertion of the small-size fuse F1 is illustrated in FIGS. 7(*a*) to 7(*d*). More particularly, the fuse F1 is fed from the fixed magazine 40 by the transferring mechanism 6 to a location between the projections 71*b* in an upper position on the pair of holding members 70, as shown in FIG. 7(*a*). At this stage, both the first claws 71 and the second claws 72 are closed in the engaged state. The first and second claws 71, 72 then are lowered by the direct-acting positioning mechanism 73 to reach the bottom end positions of the second claws 72, as shown in FIG. 7(*b*), and the second claws 72 are opened (see FIG. 7(*c*)) by the interaction of the slanted surfaces 71*a*, 72*a*, as shown in FIG. 6. The bottom end positions of the second claws 72 are set such that the second claws 72 do not contact the fuse already inserted below the second claws 72, shown as F1A in FIGS. 7(*b*) to 7(*d*). Then, only the first claws 71 are lowered to push the fuse F1 into a box by a specified engagement length (see FIG. 7(*d*)). Thereafter, the first claws 71 are moved upward or away from the box B. At this stage, the first claws 71 are opened automatically to release the fuse while the slanted surfaces 71*c* of the projections 71 slide along a flange of the fuse. In this way, the slanted surfaces 71*c* open the first claws 71. The first and second claws 71, 72 then are returned to their upper positions.

The insertion of the middle-size fuse F2 is illustrated in FIGS. 8(*a*) to 8(*d*). More particularly, the fuse F2 is fed from the fixed magazine 40 by the transferring mechanism 6 to a location between the projections 72*c* of the pair of holding members 70 in their upper positions, as shown in FIG. 8(*a*). At this stage, both the first claws 71 and the second claws 72 are closed in the engaged state. The first and second claws 71, 72 then are lowered by the direct-acting positioning mechanism 73, and the fuse F2 is pushed by upper portions 72*e* of the projections 72*c* of the second claws 72 and by the projections 71*b* located at the bottom ends of the first claws 71 to be partly inserted into the box B (see FIG. 8(*b*)). Here, partial insertion refers to a state where the fuse is inserted by a length shorter than the specified engagement length. The engaged state is released when the second claws 72 reach the bottom end positions. The closed first claws 71 then push the partly inserted fuse F2, while the second claws 72 are opened, as shown in FIG. 8(*c*). The second claws 72 then continue to push the fuse F2, and insert the second fuse F2 by the specified engagement length (see FIG. 8(*d*)). Thereafter, the first and second claws 71, 72 are returned to their upper positions as the first claws 71 are moved upward or away from the box B.

The large-size fuse F3 is inserted as shown in FIGS. 9(*a*) to 9(*d*). More particularly, the fuse F3 is fed from the fixed magazine 40 by the transferring mechanism 6 to a location between the projections 72*d* of the pair of holding members 70 in their upper positions, as shown in FIG. 9(*a*)). At this stage, both the first claws 71 and the second claws 72 are substantially closed in the engaged state. The first and second claws 71, 72 then are lowered by the direct-acting positioning mechanism 73, and the fuse F3 is pushed by the projections 72*c* which are located above the projections 72*d* of the second claws 72. This pushing causes the fuses F3 to be inserted partly into the box B, as shown in FIG. 9(*b*). A reaction force immediately acts on the second claws 72, when the insertion of the fuse starts. However, the engaged state is maintained because the reaction force is canceled by the elastic force of the compression spring. As a result, the second claws 72 can push the fuse F3 only by a short length. The second claws 72 have inserted the fuse F3 partly, but do not contact the already inserted fuse F3A shown in FIGS. 9(*b*) to 9(*d*). Further insertion causes the second claws 72 to have their movements restricted by the upwardly acting reaction force from the fuse F3. However, the first claws 71 continue to be moved downward. As a result, the engaged state is released, and the second claws 72 open, as shown in FIG. 9(*c*). Thereafter, only the first claws 71 push the upper end of the partly inserted fuse F3 into the box until the fuse F3 is inserted by the specified engagement length (see FIG. 9(*d*)). Consequently, the first and second claws 71, 72 are returned to their upper positions as the first claws 71 are moved upward or away from the box B.

Some fuse boxes have narrowly spaced fuses. In these situations, the second claws 72 would be likely to contact other fuses in the fuse box, if the second claws 72 were lowered sufficiently to insert a new fuse fully. As described above, however, the second claws 72 insert the middle-size or large-size fuses only partly. The upper end of the fuse then is pushed in fully by the first claws 71. Consequently, the second claws 72 do not contact the already inserted fuses around them. Further, the first claws 71 push only the upper end of the partly inserted fuse to push the fuse into the securely inserted condition. As a result already-inserted fuses are not contacted.

The moving mechanism 8 is adapted, as shown in FIG. 1, to move the box horizontally with respect to the transferring mechanism 6, the inserting mechanism 7 and other such parts secured to the frame 11. More particularly, the moving mechanism 8 includes a pair of direct-acting positioning mechanisms 81, 82. The positioning mechanisms 81, 82 may employ a known construction similar to the aforementioned positioning mechanisms, and are arranged so that their moving directions are orthogonal to each other. Accordingly, a movable member 83 provided on the positioning mechanism 82 can be positioned by being moved in two horizontal directions. The box is positioned and detachably mounted on the movable member 83.

According to this embodiment, fuses having different configurations can be mounted using one fixed magazine 40 and one pair of holding members 70. Specifically, the fuse is fed out through the outlet 35*b* of the fixed magazine 40 by the transferring mechanism 6. The fuse then is received between the pair of holding members 70 and is held by being placed on the pair of projections corresponding thereto. For example, the small-sized fuse F1 is held on the projections 71*b*. The holding members 70 then are displaced downward by the direct-acting positioning mechanism 73 for mounting the fuse in the box.

Since the fixed magazine 40 and the pair of holding members 70 can handle a plurality of kinds of fuses, it is sufficient to provide one each of the feeding mechanism 6, the direct-acting positioning mechanism 73, and other associated members and mechanisms in addition to the fixed magazine 40 and the pair of holding members. As a result, the inventive assembling apparatus can be made smaller than the conventional assembling apparatuses, which require a plurality of each of the above members and mechanisms.

Since the flange of the fuse is placed on and between the pair of projections of the holding members 70 with the pair of holding members 70 closed, the projections may be spaced apart only by a predetermined distance. Accordingly, the holding construction and the mechanism for opening and closing the pair of holding members 70 can be simplified more as compared to the case where the fuse is clamped. Particularly, a construction for opening and closing the holding members 70, such as an air cylinder, can be omitted in this embodiment, since the holding members 70 are opened and closed automatically.

The relatively displaceable first and second claws 71, 72 in the pair of holding members 70 are made displaceable as a unit by the engaging mechanism 90. Additionally, the second claws 72 are opened by the relative displacement of the pair of slanted surfaces 71*a*, 72*a* of the engaging mechanism 90. The first and second claws 71, 72 can be displaced as a unit, and the fuse can be inserted into the box using the projections of the respective closed claws. The fuse locked by the projections 72*c* or 72*d* of the second claws 72 then is inserted into the box. At this time, the second claws 72 are subjected to an upward acting reaction force and are displaced from the first claws 71. Accordingly, the pair of slanted surfaces 71*a*, 72*a* open the second claws, and release the second claws 72 automatically. As a result, the construction for opening the second claws 72 can be simplified. Further, the first and second claws 71, 72 are displaced with respect to each other if, for example, the downward displacement of the second claws 72 is restricted when the small-size fuse locked by the projections 71*b* of the first claws 71 is to be inserted into the box. In this situation, only the first claws 71 can be displaced downward while the second claws 72 are opened. As a result, the second claws 72 are unlikely to hinder the insertion of the small-size fuse. Therefore, fuses having different sizes can be handled easily.

The projections 71*b* may be formed with the slanted surfaces 71*c*. In this case, the projections 71*b* are displaced upward after the fuse that had been placed thereon is mounted in the box. The slanted surfaces 71*c* are displaced relatively upward while the fuse remains mounted. This relative upward displacement causes the slanted surfaces 71*c* to subjected to a reaction force while sliding along the flange of the fuse. Thus, the projections 71*b* automatically are spaced further apart to release the fuse eventually and move upward. This obviates the need to adjust the spacing of the projections 71*b* according to the size of the fuse. As a result, the construction for releasing fuse can be simplified.

The respective pairs of projections are differently spaced and positioned in the first and second claws 71, 72 of the pair of holding members 70. Thus, fuses having different configurations can be handled easily. More particularly, since the spacing between the pair of lower projections is set wider than the spacing between the pair of upper projections, the respective projections can be arranged easily when the lower projections are used for large-size fuses and the upper projections are used for small-size fuses. Specifically, the wider the spacing between the pair of projections 71*b*, 72*c* or 72*d*, the lower the pair of projections 71*b*, 72*c* or 72*d* are provided. Thus, the larger the fuse, the lower it is held. As a result, the narrowly spaced projections and the large-size fuses do not contact or interfere with each other. Therefore, the pair of holding members 70 can be used for handling fuses having different configurations.

Although the holding members 70 are movable only along vertical direction in the foregoing embodiment, they may be movable along horizontal direction.

Various other design changes can be made without departing the scope and spirit of the present invention.

Accordingly, the assembling apparatus can be made smaller since a plurality of fuses having different configurations can be handled using the parts-holding member and the pair of holding members.

Moreover, the construction for opening the second facing members can be simplified since the second facing members are opened, thereby taking advantage of the relative displacement of the first and second facing members of the pair of holding members. Further, the second facing members are unlikely to be a hindrance when small-size fuses are handled. Thus, fuses having different sizes can be easily handled.

Furthermore, the construction for releasing the fuse can be simplified, since the fuse can be automatically released by the slanted surfaces of the locking portions.

The assembling apparatus 1 also may be provided with the controller 10 as a control means for operating the respective elements described above.

The controller 10, as shown in a block diagram of FIG. 10, includes a microcomputer (CPU) as a control center, a ROM and RAM for storing a program, etc. The CPU controls the respective elements in accordance with the program. The controller 10 is connected to an operation panel 15 for inputting an operation start command, the type of the fuse box to be assembled, etc. The controller 10 also is connected to a box detection switch 16 for outputting a signal when the box is set on the moving mechanism 8. An area sensor 17 is connected to the controller 10 and is provided around or corresponding to the movable member 83 of the moving mechanism 8 when being moved forward for detecting a hand of an operator or like obstacle near the moving mechanism 8. A fuse or part detection switch 18 also is connected to the controller 10 for outputting a signal representing the presence or absence of the fuse and/or of the electric/electronic part at the outlet 35*b* of the fixed magazine 40. The cylinders, the motors, the valves and the testing device of the aforementioned units and mechanisms are connected to the controller 10 via driving circuits (not shown).

Next, the operation of the assembling apparatus 1 is described with reference to a flow chart of FIG. 11.

This assembling apparatus 1 can assemble a plurality of boxes, e.g. fuse boxes, which come in a plurality of types. A plurality of one type of fuse box may be assembled continuously or a plurality of different types of fuse boxes may be assembled successively. The following description pertains mainly to the case where several fuse boxes of the same type are assembled continuously.

A plurality of fuses is necessary to assemble one fuse box. A set of fuses of this plurality is held in the fixed magazine 40 of the assembling apparatus 1. This set of fuses also is accommodated in the movable magazine 30.

First, upon the start of the operation (Step S1), a judgment is made as to whether or not the box has been set based on a detection result of the box detection switch 16. Subsequently, when the operation of the moving mechanism 8 is judged to be safe based on a detection result of the area sensor 17, the movable member 83 is moved by the moving mechanism 8 to a position right below the inserting mechanism 7.

Next, the controller 10 causes the displacing unit 5 to displace the movable magazine 30 to the respective feeding positions to collect a set of necessary fuses in the movable magazine 30. More particularly, the fuses are fed through the outlets 2*a* of the parts feeding units 2 (Steps S2 to S6). Simultaneously with this fuse collecting operation, the mounting unit 4 mounts the fuses (Steps S11 and S12).

Fuses necessary for the fuse box of the type being assembled are collected in the movable magazine 30 as part of the fuse collecting operation (Step S4). The movable magazine 30 is moved to the parts feeding units 2 for feeding the necessary fuses in a specified order in which the fuses are mounted by the mounting unit 4. Thus, the fuses are inserted into the movable magazine 30 from the respective parts feeding units 2 in accordance with the predetermined mounting order and are aligned in a chronological order, i.e. in an order corresponding to their successive mounting in the box B.

Figure 11:
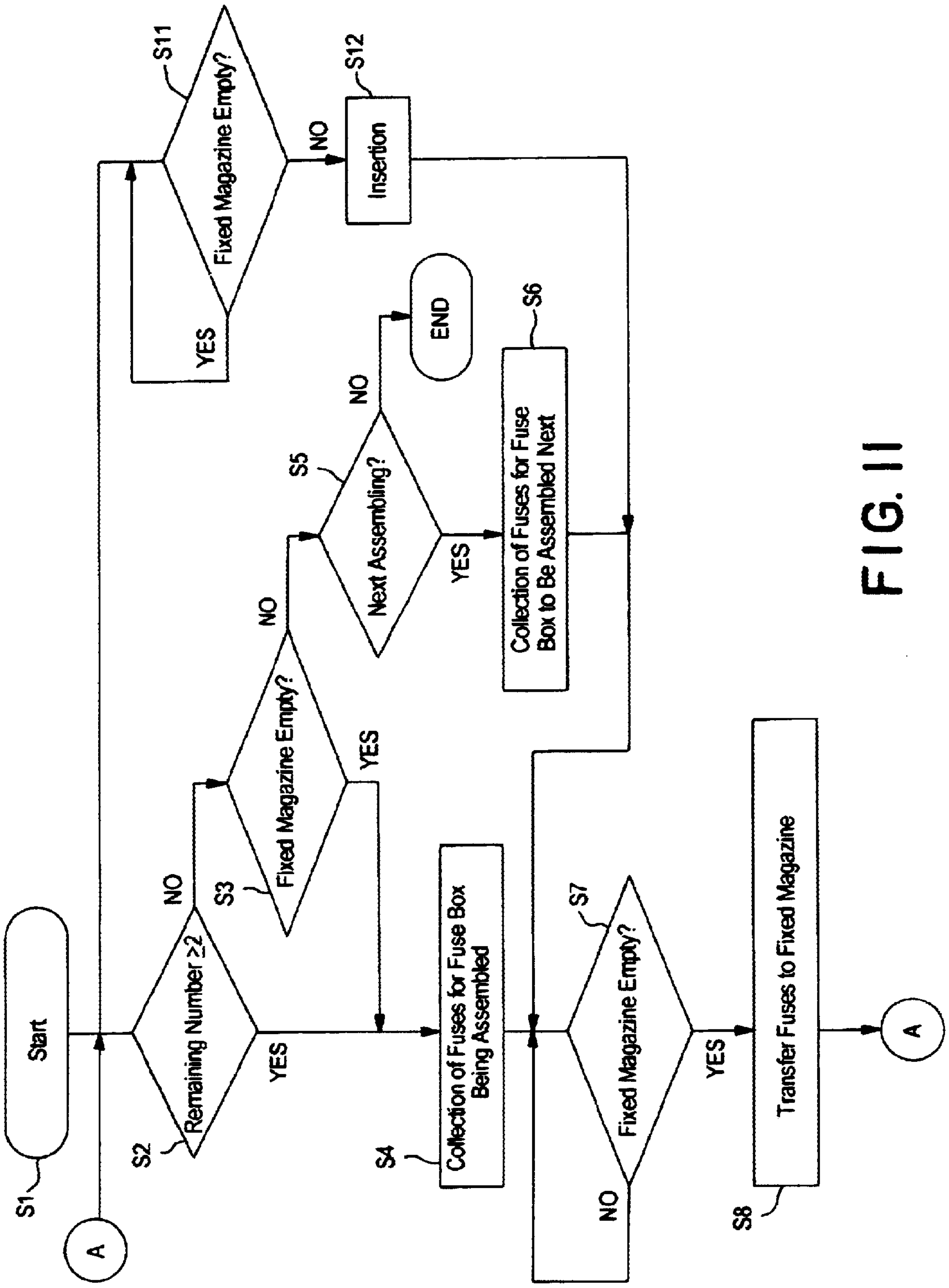
FIG. 11 is a flow chart showing contents of a control of the fuse box assembling apparatus of FIG. 1.

In instances where a plurality of fuse boxes are to be assembled, a remaining number is calculated in Step S2 of FIG. 11 as a planned number of fuse boxes to be assembled minus the number already assembled. If this remaining number of fuse boxes is 1 (NO in Step S2), then a determination is made as to whether or not the fuse is present in the fixed magazine 40. This determination is based on a detection result of the fuse detection switch 18 in Step S3. If the fuse is absent in the fixed magazine 40 (YES in Step S3), a set of fuses for the type of fuse box being assembled is collected in the movable magazine 30, as described above (Step S4).

If the fuse is still present in the fixed magazine 40 when the remaining number is 1 (NO in Step S2, NO in Step S3), then whether a next fuse box should to be assembled is determined. If assembling of the next fuse box is planned, a set of fuses for the fuse box to be assembled next is collected in the movable magazine 30 (Step S6).

On the other hand, the fuse mounting operation is performed in the mounting unit 4 simultaneously with the fuse collecting operation. Since the fuses normally are held in the fixed magazine 40 (NO in Step S11), the fuse mounting operation is started simultaneously with the start of the fuse collecting operation. The fuses are inserted one by one from the front in accordance with the order held in the fixed magazine 40 (Step S12). Upon completion of assembling, the fuses in the fixed magazine 40 are used up, and thereby empty the fixed magazine 40.

If the fixed magazine 40 is emptied (YES in Step S7) and the fuse collecting operation in Steps S4, S6 is completed, a group of fuses in the movable magazine 30 are transferred to the fixed magazine 40 by the transferring mechanism 6 of the mounting unit 4 while maintaining their aligned order (Step S8). During this time, the moving mechanism 8 moves the movable member 83 forward to replace the assembled fuse box by a box to be assembled.

Upon completion of transfer in Step S8, the fuse collecting operation is performed to collect a specified set of fuses in the movable magazine 30. Upon completion of replacement of the box in the moving mechanism 8, the fuse mounting operation is performed in the mounting unit 4 in a manner similar to the above.

If the fixed magazine 40 should be empty prior to the fuse mounting operation (YES in Step S11, YES in Step S7), the fuse mounting operation is started (Step S12) after the fuses collected in the movable magazine 30 by the fuse collecting operation are transferred to the fixed magazine 40 (NO in Steps S8, S11). The aforementioned fuse collecting operation is performed again at least partially simultaneously with the fuse mounting operation.

Thus, according to this embodiment, in the case of assembling a plurality of fuse boxes, the fuse collecting operation for the next fuse box can be performed at least partly simultaneously with the fuse mounting operation for the fuse box currently being assembled. In addition, since the fuses collected in the movable magazine 30 can be transferred to the fixed magazine 40 at once by the transferring mechanism 6 of the mounting unit 4, the pause of the mounting unit 4 for the preparation of parts can be suppressed to a minimum. As a result, quick assembling can be realized, thereby shortening, for example, a tact time, or the time required to complete the slowest step in a process where a plurality of steps are carried out substantially simultaneously.

Further, quick assembling is achieved by an improvement of the operation efficiency (a ratio of a time required for the fuse mounting operation to an operation time including a paused time for the preparation of parts) of the mounting unit 4, and the construction of the assembling apparatus 1 can be simplified since it is not necessary to provide many mounting units 4 and displacing units 5.

Further, since the assembled fuse box can be taken out simultaneously while the fuses are transferred to the fixed magazine 40 by the mounting unit 4, it is not necessary to allot time only for the fuse transferring operation. As a result, a tact time can be further shortened.

Furthermore, since the fixed magazine 40 and the movable magazine 30 can feed a plurality of different fuses in the specified order, it is sufficient to provide only one each of them instead of installing them for the respective kinds of the fuses. This brings about a higher degree of freedom in arrangement and saves space. As a result, the fuses can, for example, be fed in proximity to where the fuses are mounted in the box. Therefore, the fuse box can be assembled even more quickly.

Further, since the displacing unit 5 displaces the movable magazine 30, which is lighter than other units, it is allowed to have a simple construction and a load can be reduced. As a result, the movable magazine 30 can be displaced at a high speed and a time required to collect the fuses can be shortened.

Since the assembling apparatus 1 mounts the fuses from a plurality of parts feeding units 2 by means of the single inserting mechanism 7, the construction thereof can be simplified. Further, since the tact time can be shorted and the number of products in process can be reduced, the types of the fuse boxes can be switched quickly.

More particularly, in the fuse box assembling apparatus 1, the fuses mounted in the box are narrowly spaced from each other and need to be inserted by being pushed. Thus, the fuses can be inserted securely by the inserting mechanism 7 highly rigidly secured to the frame 11.

Further, since the fixed magazine 40 and the inserting mechanism 7 are fixed, the fuses can be fed securely to the inserting mechanism 7 from the fixed magazine 40.

In this embodiment, the fuses are tested by the testing devices of the parts feeding units 2 immediately before being collected in the movable magazine 30 and only the fuses having a satisfactory test result are collected in the movable magazine 30. Accordingly, there is no likelihood of inserting defective fuses. Further, since the inserting mechanism 7 and the fixed magazine 40 are secured to the frame 11 as described above, possibilities of insertion and feed errors into the fuse box can be reduced. This is because the fuse mounting operation cannot be resumed if there is a defective fuse or an insertion error since only a specified number of different fuses are fed in the movable magazine 30 and the fixed magazine 40. This embodiment is free from such an undesirable event.

Although the movable magazine 30 is provided separately with the inlet 35*a* at its rear end and the outlet 35*b* at its front end, one opening may be used both as the inlet 35*a* and as the outlet 35*b*.

A specified set of fuses is collected in the movable magazine 30 for one fuse box in the foregoing embodiment. However, the present invention is not limited thereto. For instance, a plurality of sets of fuses may be collected at once for a plurality of fuse boxes or a set of fuses may be collected in a plurality of times for one fuse box.

The constructions and relative arrangement of a plurality of parts feeding units 2, the movable magazine 30 and the inserting mechanism 7 are not limited to the aforementioned ones. It is sufficient to construct and relatively arrange the respective elements such that the fuses are fed from the fixed parts feeding units 2 to the inserting mechanism 7 via the displaceable movable magazine 30 to be inserted into the box.

Various other design changes can be made without departing the scope and spirit of the present invention.

Accordingly, in the case of assembling a plurality of fuse boxes, the pause of the mounting unit for the preparation of parts can be suppressed. Thus, a tact time can be shortened. Further, the construction of the assembling apparatus can be simplified since it is sufficient to provide only one mounting unit, one transferring mechanism, one fixed magazine, etc.

Furthermore, since a plurality of fuses to be mounted next can be securely collected while the fuses are mounted for the fuse box being assembled, the tact time can be even more shortened.

What is claimed is:

1. A box assembling apparatus for mounting a plurality of electric/electronic parts in a box, comprising:

a fixed mounting unit including a first parts-holding member for holding a plurality of different parts necessary to assemble a box, said first parts-holding member being configured for holding the different parts in a substantially linear array corresponding to an order in which the different parts are to be mounted in the box and being adapted to successively mount the plurality of different parts held by the first parts-holding member in the box, a plurality of fixed parts-feeding units, each including a parts feeding chamber for accommodating a specified one of the different kinds of parts and a feeding mechanism for successively feeding the respective accommodated parts, a second parts-holding member which is movable between feed positions substantially facing the respective parts-feeding units where the different parts are successively fed to the second parts-holding member in an order corresponding to the order in which the parts are to be mounted on the box and a position substantially facing the mounting unit, the second parts-holding member being configured for holding a plurality of the different parts in a substantially linear array corresponding to the order that the different parts are to be mounted by moving the second parts-holding member successively to the positions substantially facing the parts-feeding units accommodating the respective parts necessary to assemble the box, the second parts-holding member receiving and holding the different parts fed from the respective parts-feeding units, and then moved to a position substantially facing the mounting unit, and a transferring mechanism for transferring the plurality of parts held by the second parts-holding member at once to the first parts-holding member of the mounting unit when the second parts-holding member comes to the position corresponding to the mounting unit, the second parts-holding member being moved to the position corresponding to the plurality of parts-feeding units while the mounting unit is mounting a separate plurality of the different parts in the box.

2. A box assembling method for mounting a plurality of electric/electronic parts in a box, comprising:

holding in a first parts-holding member a plurality of different parts necessary to assemble the box such that said parts define a substantially linear array with an order that the different parts are to be mounted in the box;

successively mounting the plurality of different parts held by the first parts-holding member in the box;

feeding a second plurality of the different parts to a second parts-holding member in a substantially linear array and in an order corresponding to the order that the parts are to be mounted in the box;

moving the second parts-holding member that holds the second plurality of parts in the order that they are to be mounted to a position corresponding to a mounting unit; and transferring the plurality of parts held by the second parts-holding member at once to the first parts-holding member of the mounting unit with a transferring mechanism while maintaining the substantially linear array corresponding to the order in which the respective different parts are to be mounted in the box, when the second parts-holding member comes to a position corresponding to the mounting unit.

3. A box assembly method according to claim 2, wherein the step of moving the second parts-holding member is at least partially performed at the same time with the step of at least partly mounting the parts in the box by means of the mounting unit.

4. A box assembling apparatus for mounting a plurality of kinds of electric/electronic parts having different configurations in a box, comprising:

a parts-holding member for holding a plurality of different parts necessary to assemble a box while substantially arranging the parts in a substantially linear array corresponding to an order that they are to be mounted, a transferring mechanism for successively feeding the plurality of parts held by the parts-holding member through an outlet of the parts-holding member, a pair of holding members which are provided at the substantially opposite sides of the parts at the outlet in such a manner as be opened and closed with respect to each other for receiving any of the different configurations of the parts fed by the transferring mechanism to mount them in the box, at least one pair of locking portions which are provided on the pair of holding members so as to be substantially opposed to each other, each of the locking portions having a step shape comprised of a recessed upper portion and a projecting lower portion corresponding to the plurality of different configurations of the parts for engaging projected portions formed at upper ends of side surfaces of the parts when the pair of holding members are closed with respect to each other, and a vertically displacing mechanism for vertically displacing the pair of holding members between an upper position where the holding members substantially face the outlet of the parts-holding member and a lower position corresponding to a state where the respective part is at least partly mounted in the box.

5. A fuse box assembling apparatus according to claim 4, wherein the pair of holding members comprise:

a pair of first facing members which are coupled to the vertically displacing mechanism and can be opened and closed with respect to each other, a pair of second facing members provided at the opposite sides of the pair of first facing members and which can be opened and closed with respect to each other, the pair of second facing members being vertically displaceable with respect to the pair of first facing members, and an engaging mechanism for engaging the first and second facing members so as to restrict a relative displacement thereof, wherein the engaging mechanism includes a pair of slanted surfaces which are provided between the first and second facing members and can be held in sliding contact with each other, the first and second facing members being displaced as a unit by holding the pair of slanted surfaces in contact with each other while preventing their relative sliding movements, the second facing members being opened by displacing the first and second facing members with respect to each other while causing the pair of slanted surfaces to slide along each other, and the first and second facing members further having a pair of locking portions, respectively, the locking portions of the first facing member being located above and being more narrowly spaced apart than those of the second facing member for accommodating different ones of the configurations of the parts.

6. A box assembling apparatus according to claim 5, wherein the pair of locking portions have slanted surfaces, which are slanted downward in facing directions, on its portion where the part is placed.

7. A box assembling method for mounting a plurality of kinds of electric/electronic parts having different configurations in a box, comprising:

holding a plurality of parts necessary to assemble a box with a parts-holding member while substantially arranging them in a substantially linear array defining an order that parts are to be mounted, successively feeding the plurality of parts held by the parts-holding member with a transferring mechanism through an outlet of the parts-holding member while maintaining the substantially linear array and the order, successively receiving the parts fed by the transferring mechanism by means of a pair of holding members which are provided at substantially opposite sides of the part at the outlet in such a manner as to be opened and closed with respect to each other to successively mount the parts in the box, and vertically displacing the pair of holding members with a vertically displacing mechanism between an upper position where the holding members substantially face the outlet of the parts-holding member and a lower position corresponding to a state where the respective part is at least partly mounted in the box.

* * * * *